(12) United States Patent
Deguchi

(10) Patent No.: US 6,916,187 B2
(45) Date of Patent: Jul. 12, 2005

(54) GROUND CONNECTION STRUCTURE, GROUND CONNECTING MEMBER AND GROUND CONNECTION METHOD

(75) Inventor: Masaru Deguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/046,095

(22) Filed: Jan. 16, 2002

(65) Prior Publication Data

US 2002/0098726 A1 Jul. 25, 2002

(30) Foreign Application Priority Data

Jan. 19, 2001 (JP) .................................... 2001-012470

(51) Int. Cl.$^7$ ............................................... H01R 4/66
(52) U.S. Cl. ........................................................ 439/92
(58) Field of Search ............................ 439/92, 95, 91, 439/96, 66, 591, 83, 82, 751, 943; 174/250–268; 361/748–774, 783, 799, 825

(56) References Cited

U.S. PATENT DOCUMENTS 4,823,235 A  4/1989 Suzuki et al.
6,535,394 B1 * 3/2003 Hirzmann .................... 361/761

FOREIGN PATENT DOCUMENTS

| EP | 0 678 830 A1 | 10/1995 |
| EP | 0 954 067 A2 | 11/1999 |
| EP | 1 014 774 A2 | 6/2000 |
| JP | 02-250276 A | 10/1990 |
| JP | 06-085476 A | 3/1994 |
| JP | 08-181476 A | 7/1996 |
| JP | 11-204162 | 7/1999 |
| WO | WO 96/31919 A1 | 10/1996 |

* cited by examiner

*Primary Examiner*—P. Austin Bradley
*Assistant Examiner*—Phuongchi Nguyen
(74) *Attorney, Agent, or Firm*—Sughrue Mion, PLLC

(57) ABSTRACT

A ground connecting member is connected to a ground formed on a substrate. The ground connecting member has elasticity and conductivity. The substrate is fixed on a compensating member for compensating for an area of the ground. At this time, the ground connecting member is sandwiched between the substrate and the compensating member. In this structure, the ground connecting member contacts the compensating member, and electrically connects the ground with the compensating member in a low impedance state.

30 Claims, 9 Drawing Sheets

GROUND CONNECTION STRUCTURE, GROUND CONNECTING MEMBER AND GROUND CONNECTION METHOD

BACKGROUND OF THE INVENTION

1. Field of the Invention

The present invention relates to the structure for connecting a ground on a substrate to a compensating member for compensating for an area of the ground, and relates also to a member and a method for connecting the ground to the compensating member.

2. Description of the Related Art

As a method for restraining the EMI (Electro Magnetic Interference of electronic units, a method for increasing the area of the ground (the earth) is well known.

In a technique disclosed in Unexamined Japanese Patent Application KOKAI Publication No. H11-204162, an enlargement ground member for compensating for the area of the ground is fixed into the casing, and a substrate of a circuit and the enlargement ground member are fixed by metal screws, etc. The metal screws are in contact with the ground of the substrate, so as to electrically connect the ground and the enlargement ground member.

To lower the impedance between the ground and the enlargement ground member, it is necessary to connect the ground and the enlargement ground member at a plurality of points.

In the case where the metal screws are employed in the above structure, the ground should be connected with the enlargement ground member using the plurality of metal screws. According to the technique disclosed in the above publication, other than those screws necessary for fixing the substrate to the enlargement ground member, a large number of metal screws are necessary for lowering the impedance between the ground the enlargement ground member.

To maintain the electric connection between the ground and the enlargement ground member, bosses which catch the metal screws need to be prepared on the enlargement ground member. That is, in the case where the plurality of metal screws are employed, a plurality of bosses need to be prepared on the enlargement ground member.

As described above, according to the technique of the above publication, a large number of component parts for connecting the ground of the substrate with the enlargement ground member are required. Hence, the structure for connecting the component parts will inevitably be complicated, and a large number of connection processes are required.

The entire contents of Unexamined Japanese Patent Application KOKAI Publication No. H11-204162 are incorporated herein by reference in its entirety.

SUMMARY OF THE INVENTION

The present invention has been made in consideration of the above. It is accordingly an object of the present invention to provide the ground connection structure, ground connecting member, ground connection method for easily connecting a ground of a substrate to a compensating member for compensating for the area of the ground.

In order to attain the above object, according to the first aspect of the present invention, there is provided a ground connection structure comprising:

a substrate, on whose surface a ground is formed;

a ground connecting member which is connected to the ground; and a compensating member which compensates for an area of the ground and is joined to the substrate such that the ground connecting member is sandwiched between the compensating member and the substrate, and wherein the ground connecting member has elasticity, contacts the compensating member by being sandwiched between the substrate and the compensating member, and electrically connects the ground with the compensating member in a low impedance state.

According to this structure, the ground of a substrate and a compensating member for compensating for the area of the ground can easily be connected with each other.

The ground connecting member may comprise:

a base which is connected to the ground; and a spacer which is arranged on the base and has elasticity.

The substrate may have at least one through-hole for fixing the ground connecting member on the substrate; and the base may include at least one lead, which is inserted into the at least one through-hole and connected to the ground.

The at least one lead may have elasticity and a protruding portion for fixing the ground connecting member onto the substrate.

The base may have at least one lead having a margin, left for being connected to the ground and formed in parallel with a surface of the ground.

The spacer may include a plate spring.

The spacer may include a coil spring.

In order to attain the above object, according to the second aspect of the present invention, there is provided an ground connecting member, which is arranged between a substrate and a compensating member which compensates for an area of ground formed on the substrate, and which electrically connects the ground and the compensating member, and the ground connecting member comprising:

a base which is connected to the ground; and a spacer which is arranged on the base and has elasticity, and wherein the spacer is in contact with the compensating member, in a state where the ground connecting member is sandwiched between the substrate and the compensating member, and electrically connects the ground and the compensating member in a low impedance state.

The substrate may have at least one through-hole for fixing the ground connecting member onto the substrate;

the base may have at least one lead to be inserted into the at least one throughhole; and the at least one lead may have elasticity and a protruding portion for fixing the ground connecting member onto the substrate.

The base may have at least one lead having a margin, left for being connected to the ground and being in parallel with a surface of the ground.

The spacer may include a plate spring.

The spacer may include a coil spring.

In order to attain the above object, according to the third aspect of the present invention, there is provided a ground connection method comprising:

connecting an ground connecting member having elasticity and conductivity, to ground formed on a substrate; and arranging a compensating member for compensating for an area of the ground, on the substrate such that the ground connecting member is sandwiched between the compensating member and the substrate, thereby electrically connecting the ground and the compensating member via the ground connecting member in a low impedance state.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

A ground connecting member according to the first embodiment of the present invention will now be described with reference to the accompanying drawings.

The ground connecting member of the first embodiment electrically connects a ground wiring formed on the internal substrate of an electronic unit with a chassis used as a compensating member for compensating for the area of the ground.

Figure 1:
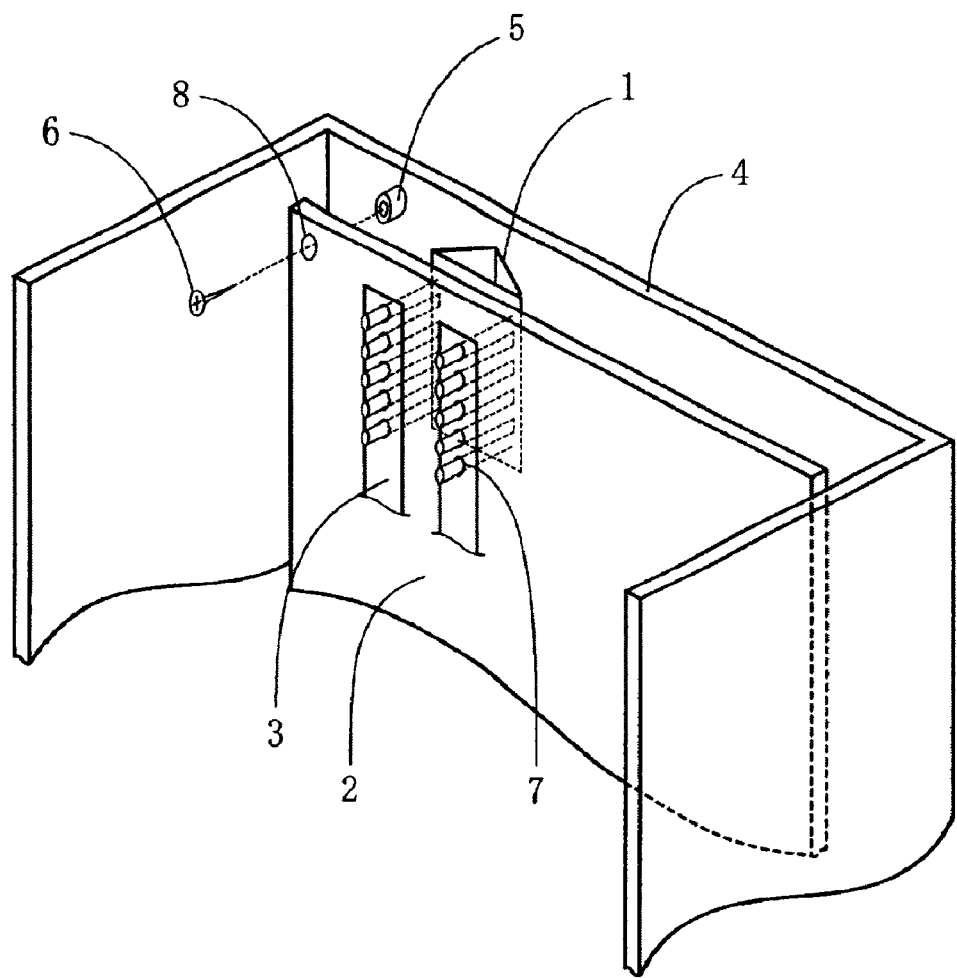
FIG. 1 is a diagram showing the positional relationship of a ground connecting member, an internal substrate and a chassis.

FIG. 1 is a diagram showing the positional relationship of a ground connecting member 1, an internal substrate 2 and a chassis 4.

As shown in FIG. 1, the ground connecting member 1 is installed on the back surface of the internal substrate 2, and connected to the ground wiring 3 formed on the front surface of the internal substrate 2. The ground connecting member 1 is sandwiched between the internal surface 2 and the chassis 4, thereby electrically connecting the ground wiring 3 and the chassis 4.

The internal substrate 2 has a plurality of through-holes 7 for fixing the ground connecting member 1 on the internal substrate 2 and a screw hole 8 through which a screw 6 for fixing the internal substrate 2 on the chassis 4 passes.

The plurality of through-holes 7 are formed in such positions that the ground connecting member 1 can be soldered on the ground wiring 3 so as to be connected thereto.

Various electronic units (not illustrated) are mounted on the surface of the internal substrate 2.

The chassis 4 is made of metal having conductivity, and has a boss 5 into which the screw 6 is inserted.

Figure 2:
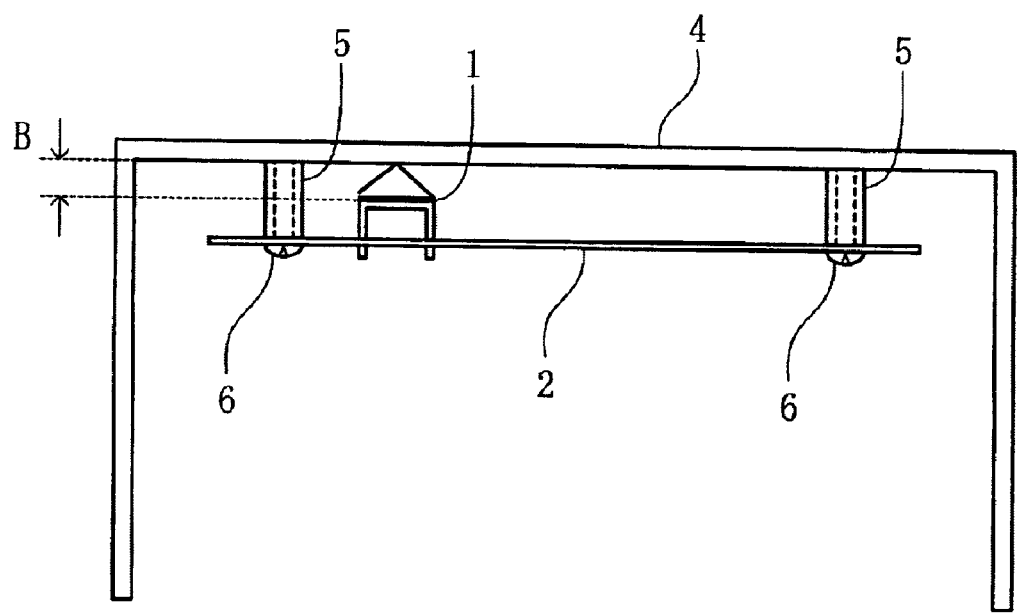
FIG. 2 is a cross sectional view showing a state, in which the internal substrate on which the ground connecting member is mounted is fixed onto the chassis.

The internal substrate 2 is fixed on the chassis 4, if the screw 6 is inserted into the boss 5, through the screw hole 8. In this structure, as shown in FIG. 2, the ground connecting member 1 is sandwiched between the internal substrate 2 and the chassis 4.

Note that only one boss 5, one screw 6 and one screw hole 8 are shown in FIG. 1. However, a plurality of bosses 5, a plurality of screws 6 and a plurality of screw holes 8 may be prepared, if they are necessary for fixing the internal substrate 2 onto the chassis 4.

The structure of the ground connecting member 1 will now specifically be described.

Figure 3:
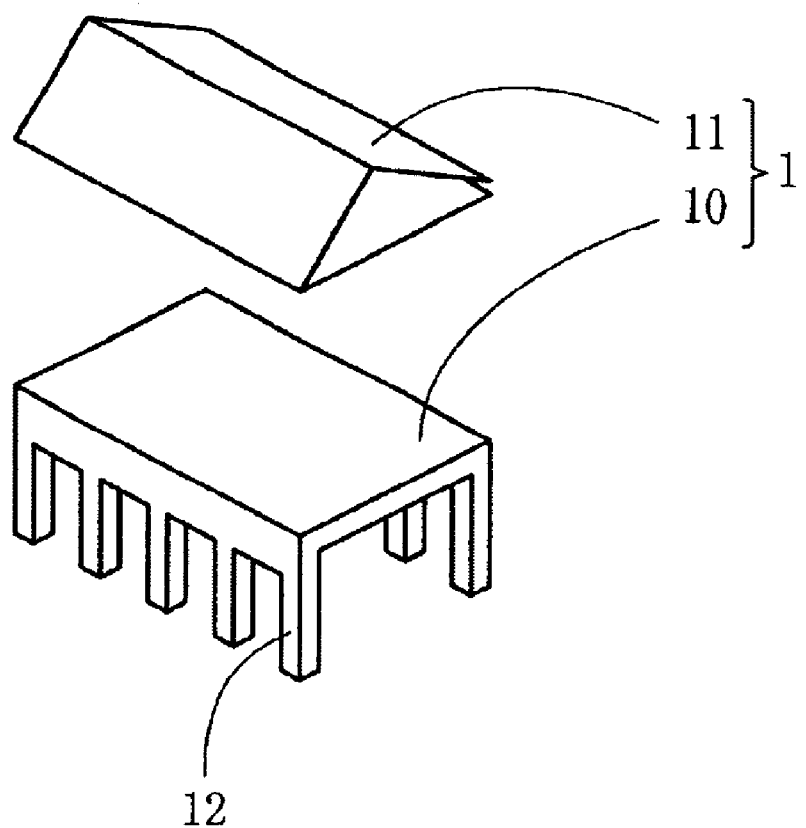
FIG. 3 is a diagram showing the structure of a ground connecting member according to the first embodiment of the present invention.

As shown in FIG. 3, the ground connecting member 1 comprises a base section 10 and a metal spacer 11.

Figure 4:
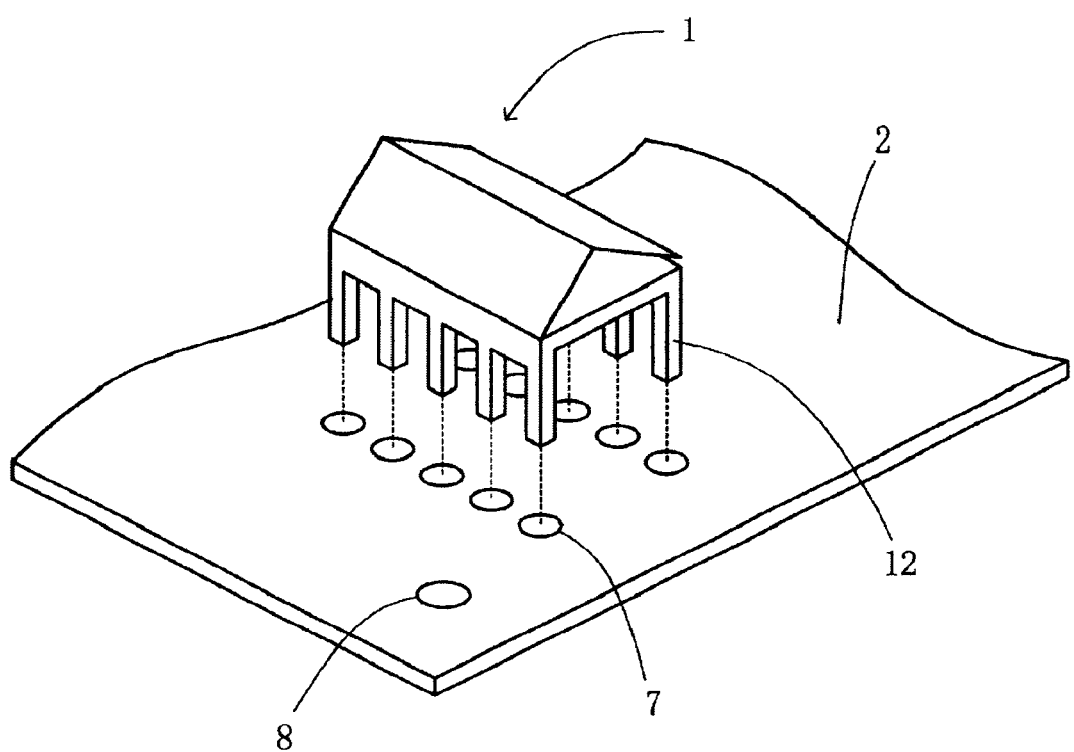
FIG. 4 is a diagram showing a method for fixing the ground connecting member onto the internal substrate.

The base section 10 has a plurality of leads 12 to be inserted into the respective through-holes 7. The leads 12 are inserted into the respective through holes 7 from the back surface of the internal substrate 2, as illustrated in FIG. 4, and then soldered on the ground wiring 3. Thus, the base section 10 (at least the leads 12 included therein) are formed from materials (e.g. copper, tin, etc.) which have conductivity and which can easily be adhered to solder.

The metal spacer 11 is connected to the base section 10 using a connection method (e.g. spot welding, etc.) to obtain a desired level of conductivity. The metal spacer 11 is formed of conductive metal having elasticity. Particularly, a plate spring formed of copper, aluminum, or the like may be used as the metal spacer 11. Then, the metal spacer 11 repels the pressure which is applied by the internal substrate 2 and the chassis 4, and is adhered onto the surface of the chassis 4.

The pressure applied onto the metal spacer 11 can be adjusted, by adjusting the distance (the clearance "B" shown in FIG. 2) between the chassis 4 and the base section 10. That is, the narrower the clearance "B" is, the more the pressure is applied to the metal spacer 11.

Accordingly, the metal spacer 11 of the ground connecting member 1 gets smaller upon application of pressure from the internal substrate 2 and the chassis 4, thereby the electric connection between the ground wiring 3 and the chassis 4 can reliably be obtained. The metal spacer 11 is pressed against and directly connected to the chassis 4. Hence, in this structure, the ground wiring 3 and the chassis 4 are connected with each other in a low impedance state. In other words, the ground wiring 3 and the chassis 4 can be connected in a low impedance state in the simple structure and using an easy connection method, and hence resulting in a high effect of restraining noises from occurring in the electronic unit.

A ground connecting member according to the second embodiment of the present invention will now be described with reference to the accompanying drawings.

The ground connecting member of the second embodiment, like the case of the first embodiment, electrically connects the ground wiring formed on the internal substrate with the chassis used as a compensating member for compensating for the area of the ground.

Note, however, that the structure of the ground connecting member and a method for fixing the ground connecting member onto the internal substrate are different from those of the first embodiment.

Figure 5:
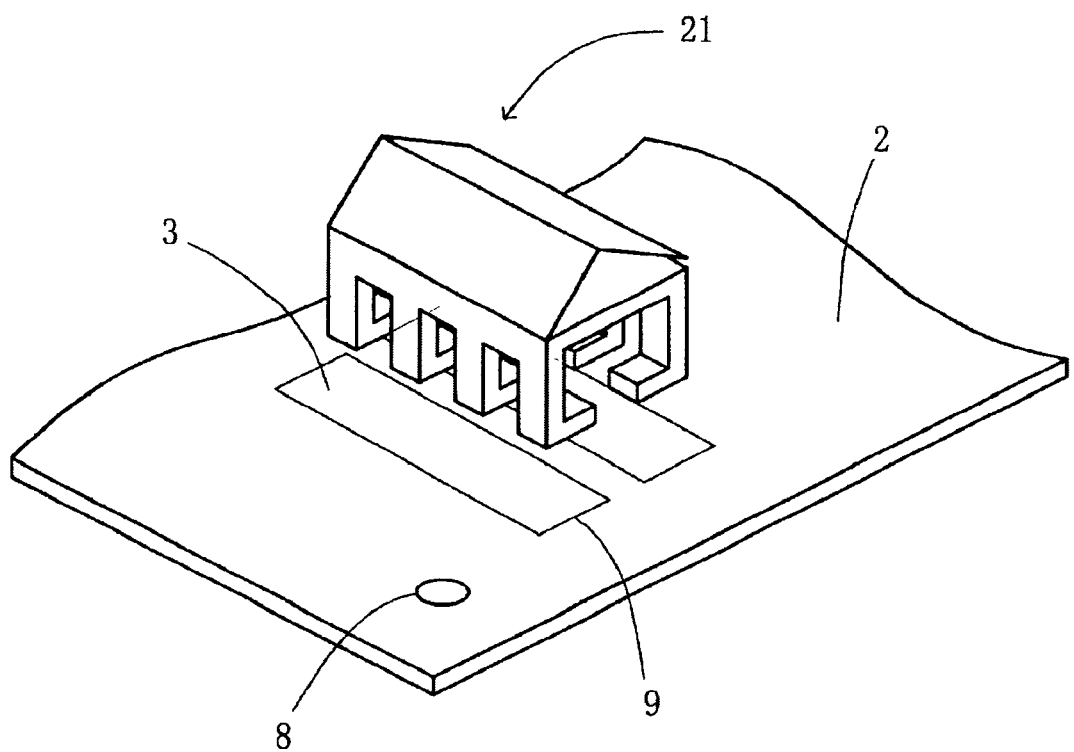
FIG. 5 is a diagram showing a method for fixing a ground connecting member, according to the second embodiment of the present invention, onto an internal substrate.

As shown in FIG. 5, the internal substrate 2 has exposure windows 9 for exposing the ground wiring 3, formed on the front surface of the internal substrate 2, to the back surface of the internal substrate 2. A ground connecting member 21 is soldered to an exposing portion of the ground wiring 3, from the back surface of the internal substrate 2.

Figure 6:
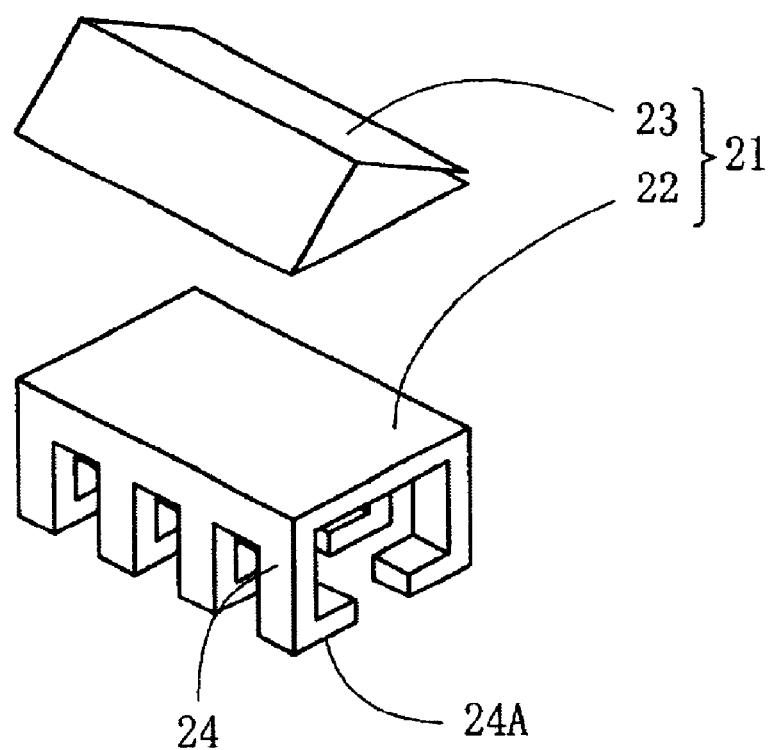
FIG. 6 is a diagram showing the structure of the ground connecting member according to the second embodiment.

FIG. 6 is a diagram showing the structure of the ground connecting member 21.

The ground connecting member 21 comprises a base section 22 and a metal spacer 23, as illustrated in FIG. 6.

The base section 22 has a plurality of leads 24 which are soldered onto the ground wiring 3. Each of the plurality of leads 24 is wider than each of the leads 12 described in the first embodiment, and is bent as illustrated in FIG. 6. A tip part 24A from the bent portion of each lead 24 is parallel to the surface of the ground wiring 3, and is used as a margin left for soldering the lead 24 to the ground wiring 3. Hence, the connection area of the lead 24 and the ground wiring 3 is large. In this structure, the lead 24 can reliably be soldered to the ground wiring 3, even when no through-hole 7 described in the first embodiment is prepared in the internal substrate 2.

The base section 22 is soldered to the ground wiring 3. Thus, like the first embodiment, the base section 22 (at least the lead 24) is formed from a material (e.g. copper, tin, etc.) which has conductivity and which can easily be adhered to solder.

The metal spacer 23 is substantially the same as the metal spacer 11 described in the first embodiment.

The ground connecting member 21 fixed on the internal substrate 2 is sandwiched between the internal substrate 2 and the chassis 4, like the first embodiment. Hence, in this structure, the ground connecting member 21 is pressed against and connected to the surface of the chassis 4.

Accordingly, the ground connecting member 21 is sandwiched between the internal substrate 2 and the chassis 4, thereby reliably connecting the ground wiring 3 and the chassis 4. Because the metal spacer 23 is pressed against and directly connected to the chassis 4, the ground wiring 3 and the chassis 4 are connected with each other in a low impedance state. In other words, the ground wiring 3 and the chassis 4 can be connected with each other in a low impedance state in the simple structure of the ground connecting member and using an easy connection method, and hence resulting in a high effect of restraining noises from occurring in the electronic unit.

Figure 7:
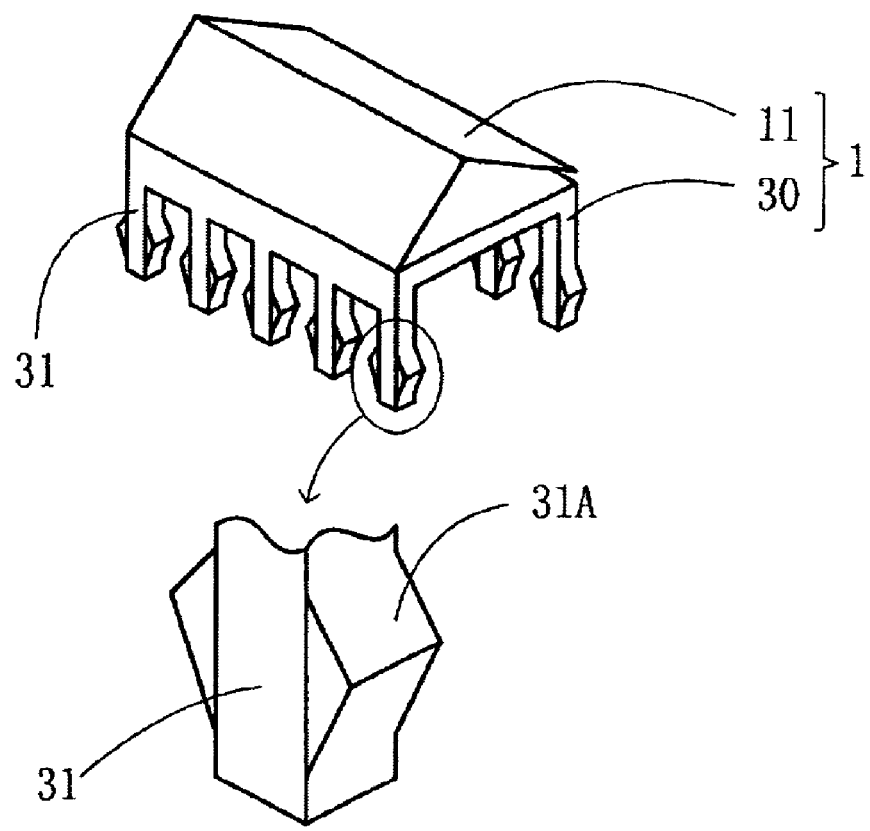
FIG. 7 is a diagram showing another structure of the ground connecting member according to the first embodiment of the present invention.

The ground connecting member 1 described in the first embodiment may include a base section 30 shown in FIG. 7. The base section 30 has a plurality of leads 31 to be inserted into the through-holes 7. Each of the leads 31 is formed of a conductive material (e.g. copper, etc.), which has elasticity. As illustrated in FIG. 7, each of the leads 31 has a protruding portion 31A for fixing the ground connecting member 1 onto the internal substrate 2. As described above, each of the leads 31 is formed of conductive material having elasticity. Thus, the ground connecting member 1 can be fixed on the internal substrate 2 and the ground connecting member 1 can be connected to the ground wiring 3 only by inserting the leads 31 into the through-holes 7, without soldering the ground connecting member 1 to the ground wiring 3.

Figure 8:
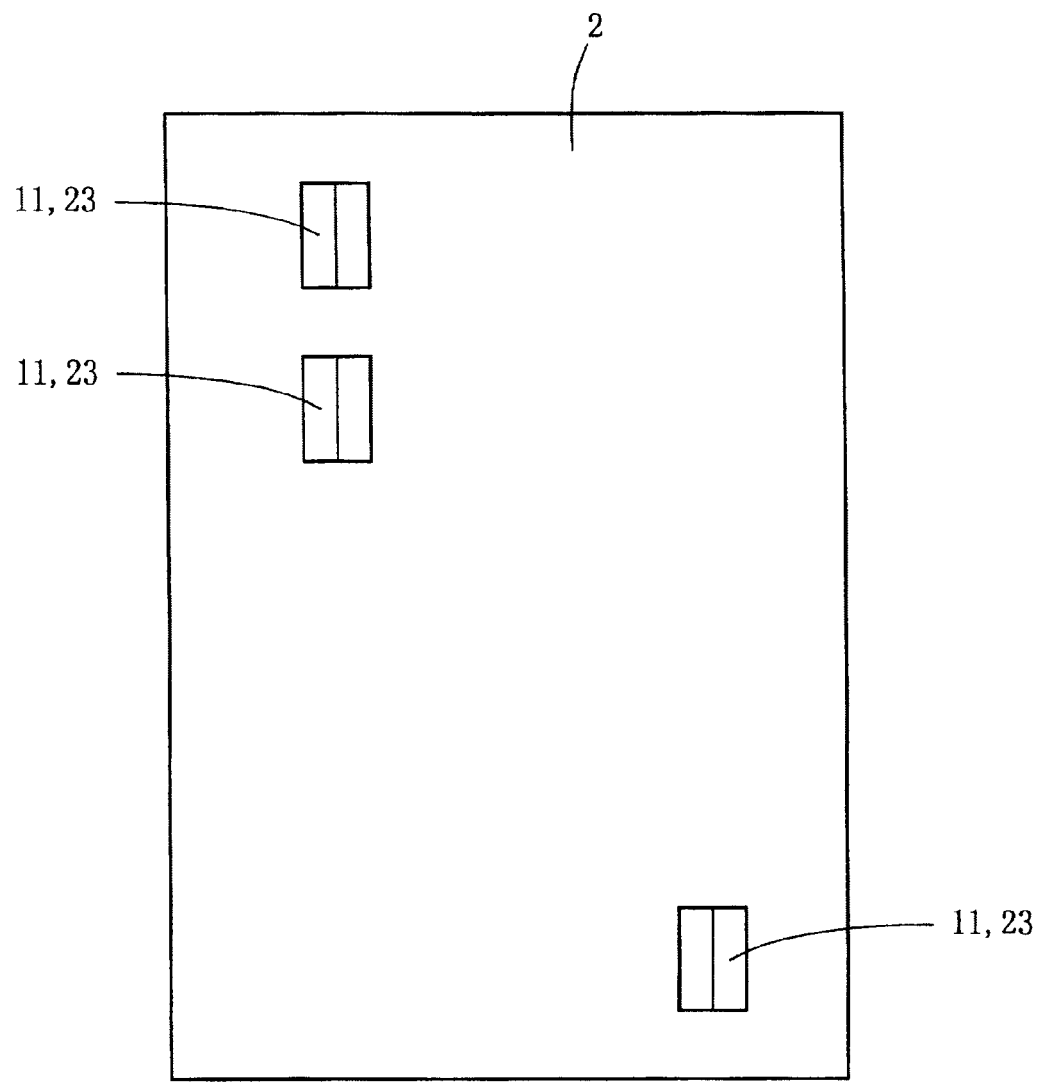
FIG. 8 is a diagram showing a state wherein a plurality of ground connecting members are fixed onto the same internal substrate.

As described in FIG. 8, a plurality of ground connecting members 1 and 21 may be fixed on the same internal substrate 2. In this structure, the ground wiring 3 and the chassis 4 can electrically be connected at a plurality of points, and hence realizing a state where the impedance is lower than the cases of the first and second embodiments.

Figure 9A:
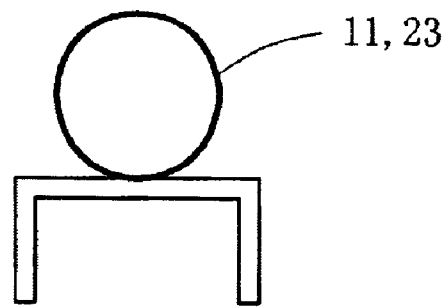
FIGS. 9A to 9C are diagram showing various shapes of a metal spacer included in the ground connecting member.
Figure 9B:
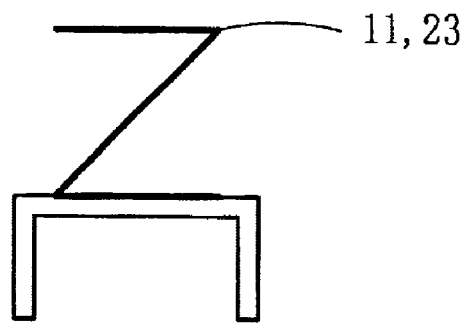

The cross section of the metal spacers 11 and 23 may be any form other than the triangle-like shape of the above-described first and second embodiments. For example, the cross section of the metal spacers 11 and 23 may be circular shown in FIG. 9A or may be a "Z"-like shape shown in FIG. 9B. Even in this case, the same effect as the above embodiments can be obtained. Note that if the cross section of the metal spacers 11 and 23 is the "Z"-like shape, the connection area between the metal spacers 11 and 23 and the chassis 4 is larger than the case where the cross section of the metal spacers 11 and 23 is triangular or circular, and hence realizing a state where the impedance is lower than the case where the cross section thereof is triangular or circular.

Figure 9C:
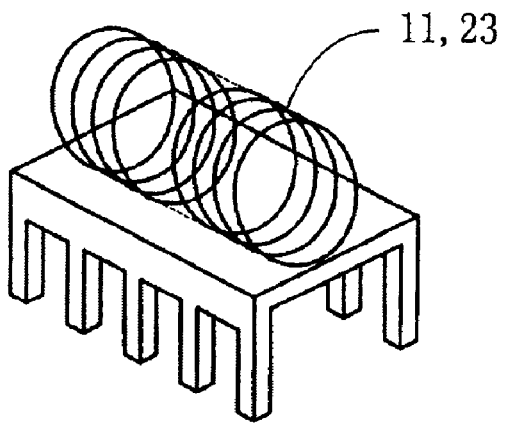

Each of the metal spacers 11 and 23 may be a coil spring, etc. as shown in FIG. 9C. Even in this structure, the same effect as that of the above embodiments can be obtained.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2001-012470 filed on Jan. 19, 2001, and including specification, claims, drawings and summary. The disclosure of the above Japanese Patent Application is incorporated herein by reference in its entirety.

What is claimed is:

1. A ground connection structure comprising:
    a substrate, on whose surface a ground is formed;
    a ground connecting member which is connected to said ground; and
    a compensating member which compensates for an area of said ground and is joined to said substrate such that said ground connecting member is sandwiched between said compensating member and said substrate, wherein said ground connecting member:
    extends from said substrate toward said compensating member; directly resiliently contacts said compensating member; and
    electrically connects said ground with said compensating member in a low impedance state,
    wherein said ground connecting member comprises: a base which is connected to said ground; and a spacer which is arranged on said base and has elasticity, and
    wherein said compensating member is contacted directly by said spacer.

2. The ground connection structure according to claim 1, wherein said base has at least one lead having a margin, left for being connected to said ground and formed in parallel with surface of said ground.

3. The ground connection structure according to claim 1, wherein said spacer includes a plate spring.

4. The ground connection structure according to claim 1, wherein said spacer includes a coil spring.

5. The ground connection structure according to claim 1, wherein the entire structure of said ground connecting member is located on one side of said compensating member.

6. The ground connection structure according to claim 1, wherein:
    said substrate has at least one through-hole for fixing said ground connecting member on said substrate; and
    said base includes at least one lead, which is inserted into the at least one through-hole and connected to said ground.

7. The ground connection structure according to claim 3, wherein
    said at least one lead has elasticity and a protruding portion for fixing said ground connecting member onto said substrate.

8. A ground connecting member, which is arranged between a substrate and a compensating member which compensates for an area of a ground formed on said substrate, and which electrically connects said ground and said compensating member, and said ground connecting member comprising:
    a base which is connected to said ground; and
    a spacer which is arranged on said base and has elasticity, wherein:

said spacer is in direct physical contact with said compensating member; and said ground connecting member is sandwiched between said substrate and said compensating member, and electrically connects said ground and said compensating member in a low impedance state.

9. The ground connecting member according to claim 8, wherein:

said substrate has at least one through-hole for fixing said ground connecting member onto said substrate;

said base has at least one lead to be inserted into the at least one through-hole; and said at least one lead has elasticity and a protruding portion for fixing said ground connecting member onto said substrate.

10. The ground connecting member according to claim 8, wherein said base has at least one lead having a margin, left for being connected to said ground and being in parallel with surface of said ground.

11. The ground connecting member according to claim 8, wherein said spacer includes a plate spring.

12. The ground connecting member according to claim 8, wherein said spacer includes a coil spring.

13. The ground connection structure according to claim 8, wherein the entire structure of said ground connecting member is located on one side of said compensating member.

14. A ground connection method comprising:

connecting a ground connecting member having elasticity and conductivity, to a ground formed on a substrate; and arranging a compensating member for compensating for an area of said ground, on said substrate, wherein said ground connecting member;

extends from said substrate toward said compensating member;

directly resiliently contacts said compensating member, and is sandwiched between the compensating member and said substrate, thereby electrically connecting said ground and said compensating member via said ground connecting member in a low impedance state;

wherein said ground connecting member comprises: a base which is connected to said ground; and a spacer which is arranged on said base and has elasticity; and wherein said spacer is in direct physical contact with said compensating member.

15. The ground connection method according to claim 14, wherein the entire structure of said ground connecting member is located on one side of said compensating member.

16. A ground connection structure comprising:

a substrate, on whose surface a ground is formed;

a ground connecting member which is connected to said ground; and a compensating member which compensates for an area of said ground and is joined to said substrate such that said ground connecting member is sandwiched between said compensating member and said substrate, wherein said ground connecting member;

extends from said substrate toward said compensating member;

directly resiliently contacts said compensating member; and electrically connects said ground with said compensating member in a low impedance state, wherein said ground connecting member comprises a base section and a spacer;

a plurality of leads project from said base section toward said substrate, and are electrically connected to said ground; and said spacer is arranged between, and electrically connects, said base section and said compensating member, and has elasticity.

17. The ground connection structure according to claim 16, wherein:

said base section comprises a generally planar portion extending generally in parallel to said substrate; and said plurality of leads project orthogonally from said generally planar portion.

18. The ground connection structure according to claim 16, wherein:

said ground is arranged on a side of said internal substrate adjacent to said compensating member; and at least one of said plurality of leads comprises a tip part that extends generally orthogonally from said at least one of said plurality of leads to provide said electrical connection between said at least one of said plurality of leads and said ground.

19. The ground connection structure according to claim 16, wherein:

said substrate further comprises through holes;

said ground is arranged on a side of said substrate opposite to said compensating member; and said plurality of leads pass through said through holes to be electrically connected to said ground.

20. The ground connection structure according to claim 19, wherein:

a distal end of at least one of said plurality of leads comprises a protruding section integral to said at least one of said plurality of leads;

when said plurality of leads pass through said through holes, said protruding section is arranged on a side of said substrate opposite to said base section, and mechanically fixes said substrate between said protruding section and said base section, so that no solder is required to connect said at least one of said plurality of leads to said ground.

21. A ground connection structure comprising:

a substrate, on whose surface a ground is formed;

a ground connecting member which is connected to said ground; and a compensating member which compensates for an area of said ground and is joined to said substrate such that said ground connecting member is sandwiched between said compensating member and said substrate, and wherein said ground connecting member extends from said substrate toward said compensating member to resiliently contact said compensating member by being sandwiched between said substrate and said compensating member, and electrically connects said ground with said compensating member in a low impedance state; wherein:

said ground connecting member comprises a base which is connected to said ground and a spacer which is arranged on said base and has elasticity; and wherein said compensating member is contacted directly by said spacer.

22. A ground connection structure comprising:

a substrate, on whose surface a ground is formed;

a ground connecting member which is connected to said ground; and a compensating member which compensates for an area of said ground and is joined to said substrate such that said ground connecting member is sandwiched between said compensating member and said substrate, and wherein said ground connecting member extends from said substrate toward said compensating member to resiliently contact said compensating member by being sandwiched between said substrate and said compensating member, and electrically connects said ground with said compensating member in a low impedance state; wherein:

said ground connecting member comprises a base section and a spacer;

a plurality of leads project from said base section toward said substrate, and are electrically connected to said ground; and said spacer is arranged between, and electrically connects, said base section and said compensating member, and has elasticity.

23. The ground connection structure according to claim 22, wherein:

said base section comprises a generally planar portion extending generally in parallel to said substrate; and said plurality of leads project orthogonally from said generally planar portion.

24. The ground connection structure according to claim 22, wherein:

said substrate further comprises through holes;

said ground is arranged on a side of said substrate opposite to said compensating member; and said plurality of leads pass through said through holes to be electrically connected to said ground.

25. The ground connection structure according to claim 22, wherein:

a distal end of at least one of said plurality of leads comprises a protruding section integral to said at least one of said plurality of leads;

when said plurality of leads pass through said through holes, said protruding section is arranged on a side of said substrate opposite to said base section, and mechanically fixes said substrate between said protruding section and said base section, so that no solder is required to connect said at least one of said plurality of leads to said ground.

26. The ground connection structure according to claim 22, wherein:

said ground is arranged on a side of said internal substrate adjacent to said compensating member; and at least one of said plurality of leads comprises a tip part that extends generally orthogonally from said at least one of said plurality of leads to provide said electrical connection between said at least one of said plurality of leads and said ground.

27. A ground connecting member, which is arranged between a substrate and a compensating member which compensates for an area of a ground formed on said substrate, and which electrically connects said ground and said compensating member, and said ground connecting member comprising:

a base which is connected to said ground; and a spacer which is arranged on said base and has elasticity; wherein said spacer is in contact with said compensating member, in a state where said ground connecting member is sandwiched between said substrate and said compensating member, and electrically connects said ground and said compensating member in a low impedance state; and said compensating member is contacted directly by said spacer.

28. A ground connection method comprising:

connecting a ground connecting member having elasticity and conductivity, to a ground formed on a substrate; and arranging a compensating member for compensating for an area of said ground, on said substrate such that said ground connecting member extends from said substrate toward said compensating member to resiliently contact said compensating member and is sandwiched between the compensating member and said substrate, thereby electrically connecting said ground and said compensating member via said ground connecting member in a low impedance state, wherein said ground connecting member comprises a base which is connected to said ground and a spacer which is arranged on said base and has elasticity, and said compensating member is contacted directly by said spacer.

29. A ground connection structure comprising:

a substrate, on whose surface a ground is formed;

a ground connecting member which is connected to said ground; and a compensating member which compensates for an area of said ground and is joined to said substrate such that said ground connecting member is sandwiched between said compensating member and said substrate; wherein:

said ground connecting member comprises a proximal end fixed to said substrate, and an elastic distal end directly resiliently contacting said compensating member; and said ground connecting member electrically connects said ground with said compensating member in a low impedance state.

30. A ground connection method comprising:

connecting a ground connecting member having elasticity and conductivity, to a ground formed on a substrate; and arranging a compensating member for compensating for an area of said ground, on said substrate; wherein:

said ground connecting member comprises a proximal end fixed to said substrate, and a elastic distal end directly resiliently contacting said compensating member;

said ground connecting member is sandwiched between the compensating member and said substrate; and said ground connecting member electrically connects said ground with said compensating member in a low impedance state.

* * * * *